(12) United States Patent
Cui

(10) Patent No.: US 11,315,992 B2
(45) Date of Patent: Apr. 26, 2022

(54) ARRAY SUBSTRATE AND METHOD FOR PREPARING THE SAME, DISPLAY PANEL AND DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/957,369

(22) PCT Filed: Dec. 26, 2019

(86) PCT No.: PCT/CN2019/128735
§ 371 (c)(1),
(2) Date: Jun. 23, 2020

(87) PCT Pub. No.: WO2020/164317
PCT Pub. Date: Aug. 20, 2020

(65) Prior Publication Data
US 2021/0175302 A1 Jun. 10, 2021

(30) Foreign Application Priority Data
Feb. 15, 2019 (CN) .......................... 201910117700.1

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01); *H01L 2251/558* (2013.01)

(58) Field of Classification Search
None
See application file for complete search history.

(56) References Cited

U.S. PATENT DOCUMENTS

2013/0075737 A1\* 3/2013 Hong .................. H01L 27/3246
257/59
2016/0247862 A1 8/2016 Song et al.
(Continued)

FOREIGN PATENT DOCUMENTS

CN 104409647 A 3/2015
CN 108364875 A 8/2018
(Continued)

OTHER PUBLICATIONS

ISA China National Property Administration, International Search Report Issued in Application No. PCT/CN2019/128735, dated Apr. 2, 2020, WIPO, 13 pages. (Submitted with Partial Translation).
(Continued)

*Primary Examiner* — Michelle Mandala
(74) *Attorney, Agent, or Firm* — McCoy Russell LLP

(57) ABSTRACT

The present disclosure provides an array substrate, including: a base substrate; a planarization layer formed on the base substrate; a plurality of pixel electrodes formed on the planarization layer; and a pixel definition layer including a first pixel definition layer and a second pixel definition layer, the first pixel definition layer covering a periphery of each pixel electrode and exposing a central area of each pixel electrode, the second pixel definition layer being formed on the planarization layer between adjacent pixel electrodes and having a plurality of openings defining each sub-pixel unit; a bottom of a dam portion of the second pixel definition layer and a bottom of a dam portion of the first pixel definition layer adjacent thereto are separated by a predetermined distance, and a thickness of the second pixel definition layer is greater than a thickness of the first pixel definition layer.

10 Claims, 3 Drawing Sheets

(56) References Cited

U.S. PATENT DOCUMENTS

2016/0293683 A1   10/2016   Hou et al.
2020/0044169 A1    2/2020   Zhao

FOREIGN PATENT DOCUMENTS

| CN | 108364975 A | 8/2018 |
| CN | 108922912 A | 11/2018 |
| CN | 108962936 A | 12/2018 |
| CN | 109148538 A | 1/2019 |
| CN | 109285963 A | 1/2019 |
| CN | 109887961 A | 6/2019 |

OTHER PUBLICATIONS

State Intellectual Property Office of the People's Republic of China, Office Action and Search Report Issued in Application No. 201910117700.1, dated Jul. 16, 2020, 14 pages. (Submitted with Partial Translation).

* cited by examiner

ARRAY SUBSTRATE AND METHOD FOR PREPARING THE SAME, DISPLAY PANEL AND DISPLAY DEVICE

CROSS-REFERENCE TO RELATED APPLICATIONS

The present application is a U.S. national phase application of International Application No. PCT/CN2019/128735 filed on Dec. 26, 2019, which claims a priority to Chinese Patent Application No. 201910117700.1 filed on Feb. 15, 2019. The entire contents of each of the above-listed applications are hereby incorporated by reference for all purposes.

TECHNICAL FIELD

The present disclosure relates to the field of display technology, in particular, to an array substrate and a method for preparing the same, a display panel, and a display device.

BACKGROUND AND SUMMARY

Technology of inkjet printing polymer light-emitting diode (PLED) display has the advantages of simple operation, low cost, simple process, easy realization of large size, etc. With the continuous research and development of high-performance polymer materials and the further improvement of thin film preparation technology, PLED technology is expected to achieve rapid industrialization.

During the inkjet printing drying film formation process, the solvent vapor volatilizes relatively fast in the edge area of droplets, which will cause the droplets to flow from the center to the edge of the solution. This flow will drive the solute to migrate to the edge of the droplet, and eventually deposit on the edge to form a deposition morphology having a thick edge and a thin center, called the "coffee ring effect". Thus, the film formation in the pixel very uneven, thereby causing the device to emit light unevenly.

An aspect of the present disclosure provides an array substrate, including: a base substrate; a planarization layer formed on the base substrate; a plurality of pixel electrodes formed on the planarization layer; and a pixel definition layer including a first pixel definition layer and a second pixel definition layer, the first pixel definition layer covering a periphery of each of the plurality of pixel electrodes and exposing a central area of each of the plurality of pixel electrodes, the second pixel definition layer being formed on the planarization layer between adjacent pixel electrodes and having a plurality of openings defining each sub-pixel unit; a bottom of a dam portion of the second pixel definition layer and a bottom of a dam portion of the first pixel definition layer adjacent thereto are separated by a predetermined distance, and a thickness of the second pixel definition layer is greater than a thickness of the first pixel definition layer.

According to an embodiment of the present disclosure, the first pixel definition layer has a thickness of 100 nm to 500 nm, and the second pixel definition layer has a thickness of 1 μm to 3 μm.

According to another embodiment of the present disclosure, a width of the first pixel definition layer covering the periphery of each of the plurality of pixel electrodes is 1 μm to 10 μm.

According to another embodiment of the present disclosure, the first pixel definition layer includes one or more of silicon nitride and silicon oxide.

According to another embodiment of the present disclosure, the second pixel definition layer includes a photoresist material.

Another aspect of the present disclosure provides a display panel including any one of the above array substrates.

According to an embodiment of the present disclosure, the plurality of openings of the second pixel defining layer is formed with an organic light-emitting layer of each sub-pixel unit, a thickness of the organic light-emitting layer being greater than a thickness of the first pixel definition layer.

Another aspect of the present disclosure also provides a display device, including any one of the above display panels.

Another aspect of the present disclosure provides a method for preparing an array substrate, including: forming a planarization layer on a base substrate; forming a plurality of pixel electrodes on the planarization layer; forming a first pixel definition layer to cover a periphery of each of the pixel electrodes, the first pixel definition layer exposing a central area of each of the plurality of pixel electrodes; and forming a second pixel definition layer on the planarization layer between adjacent pixel electrodes, the second pixel definition layer having a plurality of openings defining each sub-pixel unit; in which a bottom of a dam portion of the second pixel definition layer and a bottom of a dam portion of the first pixel definition layer adjacent thereto are separated by a predetermined distance, and a thickness of the second pixel definition layer is greater than a thickness of the first pixel definition layer.

According to an embodiment of the present disclosure, the forming the first pixel definition layer includes: forming an insulating dielectric layer covering the planarization layer and the plurality of pixel electrodes; and etching the insulating dielectric layer to form the first pixel definition layer.

According to another embodiment of the present disclosure, the insulating dielectric layer includes one or more of silicon nitride and silicon oxide.

According to another embodiment of the present disclosure, the forming the second pixel definition layer includes: forming a photoresist layer covering the planarization layer, the first pixel definition layer, and the pixel electrode; and patterning the photoresist material layer to form the second pixel definition layer.

BRIEF DESCRIPTION OF THE DRAWINGS

The above and other features and advantages of the present disclosure will become more apparent by describing the exemplary embodiments thereof in conjunction with the drawings.

DETAILED DESCRIPTION

Figure 1:
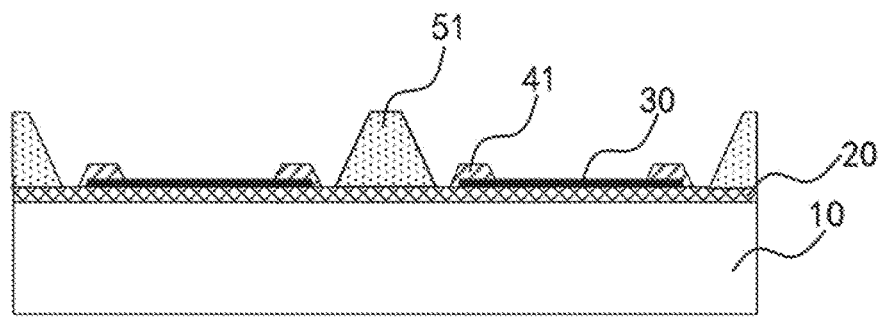
FIG. 1 is a schematic view showing an array substrate according to an embodiment of the present disclosure.

Exemplary embodiments will now be described in more details with reference to the drawings. However, the example embodiments can be implemented in various forms and should not be construed as being limited to the embodiments set forth herein; on the contrary, these embodiments are provided such that the present disclosure will be comprehensive and complete and the idea of the exemplary embodiments will be well understood by a person skilled in the art. In the drawings, the thicknesses of areas and layers are exaggerated for clarity. The similar reference numerals in the drawings denote the same or similar structures, and thus their detailed description will be omitted.

It should be noted that the terms "upper" and "lower" in this disclosure are merely relative concepts or refer to the normal use state of the product, and should not be considered as limitation.

Inkjet printing technology is to inject hole injection rials, and solutions of red, green, and blue light-emitting materials, through micron-scale print nozzles, respectively, into the sub-pixel pits on the ITO substrate that have been patterned in advance to form the red, green, and blue primary light-emitting pixel units. The thickness of the film layer is determined by the amount of solute printed in the pixel Since this method can greatly save expensive light-emitting materials and the printing time (128 or 256 nozzles) can be greatly reduced by using a nozzle with a plurality of ejection ports, inkjet printing color patterning technology has been recognized as the mainstream technology for industrialization in the field of preparing PLED.

FIG. 1 shows a schematic view showing an array substrate according to an embodiment of the present disclosure. As shown in FIG. 1, the array substrate includes a base substrate 10, a planarization layer 20, a plurality of pixel electrodes 30, and a pixel definition layer. The pixel definition layer includes a first pixel definition layer 41 and a second pixel definition layer 51. The first pixel definition layer 41 covers a periphery of each of the plurality of pixel electrodes 30 and exposes a central area of each of the plurality of pixel electrodes 30. The second pixel definition layer 51 is formed on the planarization layer 20 between adjacent pixel electrodes 30 and has a plurality of openings defining each sub-pixel unit. A bottom of a dam of the second pixel definition layer 51 and a bottom of a dam of the first pixel definition layer 41 adjacent thereto are separated by a predetermined distance. A thickness of the second pixel definition layer 51 is greater than a thickness of the first pixel definition layer 41.

Optionally, the first pixel definition layer 41 has a thickness of 100 nm to 500 nm, and the second pixel definition layer 51 has a thickness of 1 μm to 3 μm. Optionally, the first pixel definition layer 41 has a thickness of 300 nm, and the second pixel definition layer 51 has a thickness of 1.5 μm.

The first pixel definition layer 41 covers a periphery of each of the plurality of pixel electrodes 30 to prevent device leakage. Therefore, if the width of the first pixel definition layer 41 covering the periphery of each of the plurality of pixel electrodes 30 is too narrow, it is not capable of preventing device leakage; and if it is too wide, the area covering the plurality of each of the plurality of pixel electrodes 30 is too large to affect the light-emitting area, thereby reducing the light-emitting efficiency. Therefore, a width of the first pixel definition layer 41 covering the periphery of each of the plurality of pixel electrodes 30 is optionally 1 μm to 10 μm, for example, 3 μm.

The first pixel definition layer 41 may be formed of an inorganic insulating material, such as one or more of silicon nitride and silicon oxide. The second pixel definition layer 51 may be formed of an organic insulating material, for example, but not limited to a photoresist material.

The bottom of the dam of the second pixel definition layer 51 and the bottom of the dam of the first pixel definition layer 41 are separated from a predetermined distance, so that there is no pixel electrode 30 in the area between the dam of the second pixel definition layer 51 in the opening defined by the second pixel definition layer 51 and the dam of the first pixel definition layer 41, see FIG. 1 for the specific structure.

Figure 2:
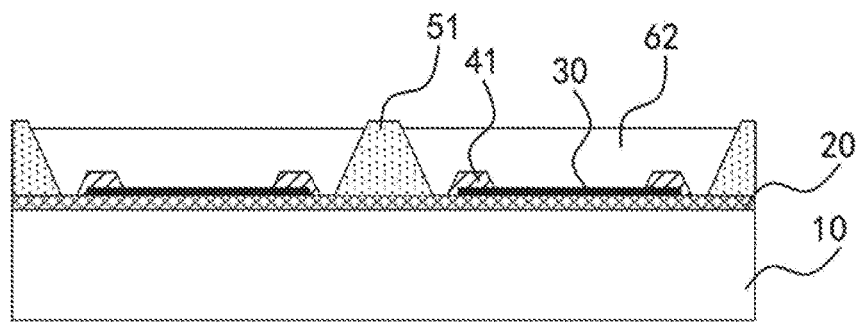
FIG. 2 is a schematic view showing a display panel according to an embodiment of the present disclosure.

FIG. 2 shows a display panel including the array substrate shown in FIG. 1, in which the thickness of the organic light-emitting layer 62 is greater than the thickness of the first pixel definition layer 41. That is, the organic light-emitting layer 62 covers the first pixel definition layer 41 in the display panel.

Figure 3A:
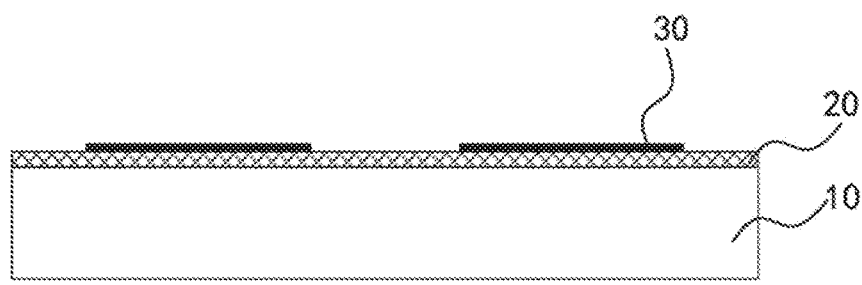
FIGS. 3A to 3E are schematic views showing a method for preparing an array substrate according to an embodiment of the present disclosure.

FIGS. 3A to 3E show a method for preparing an array substrate according to an embodiment of the present disclosure. As shown in FIG. 3A, firstly, a planarization layer 20 is formed on the base substrate 10. After that, a plurality of pixel electrodes 30 corresponding to each sub-pixel unit is formed on the planarization layer 20.

Figure 3B:
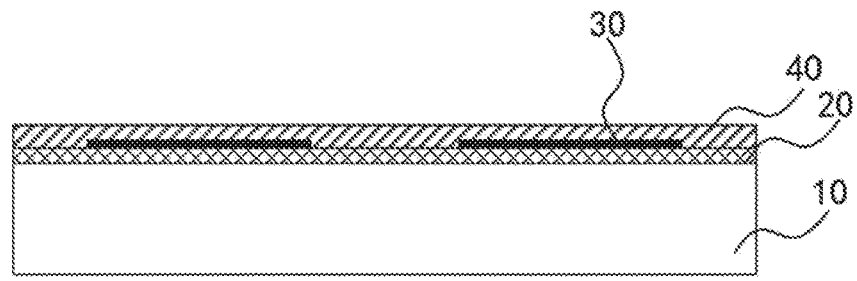

Then, as shown in FIG. 3B, an insulating dielectric layer 40 covering the planarization layer 20 and the plurality of pixel electrodes 30 is formed. The insulating dielectric layer 40 may be formed of one or more of silicon nitride and silicon oxide. The insulating dielectric layer 40 may be formed in any form, for example, the insulating dielectric layer 40 may be formed by vapor deposition or the like.

Figure 3C:
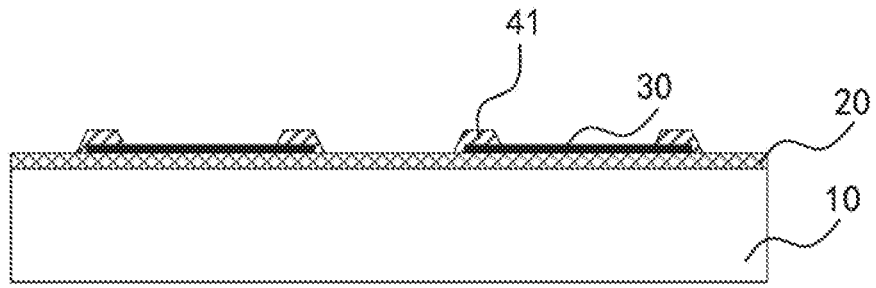

Then, as shown in FIG. 3C, the insulating dielectric layer 40 is etched by dry or wet etching process to form the first pixel definition layer 41. The first pixel definition layer 41 covers the periphery of each of the plurality of pixel electrodes 30 to avoid device leakage.

Figure 3D:
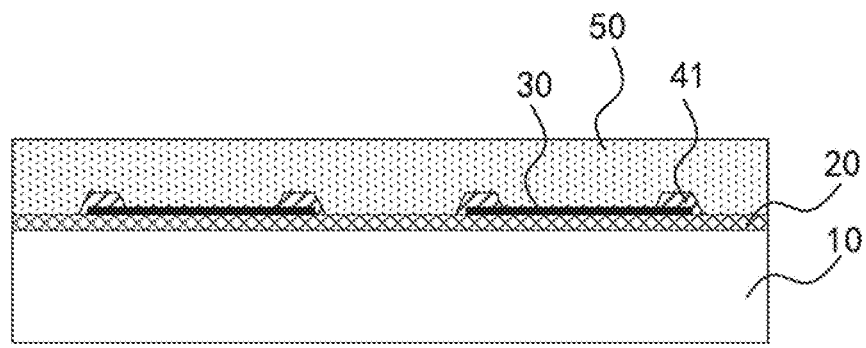

Subsequently; as shown in FIG. 3D, a photoresist layer 50 covering the planarization layer 20, the first pixel definition layer 41, and the plurality of pixel electrodes 30 are formed.

Figure 3E:
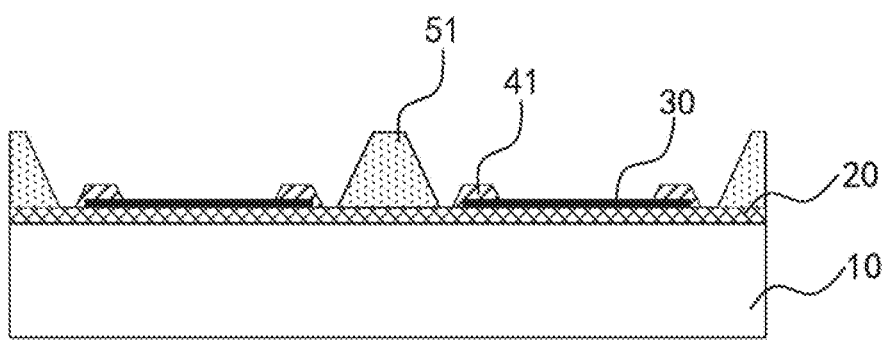

After that, the photoresist layer 50 is patterned, for example, exposed and developed to form the second pixel definition layer 51. The second pixel definition layer 51 is formed on the planarization layer 20 between adjacent pixel electrodes 30. A bottom of a dam of the second pixel definition layer 51 and a bottom of a dam of the first pixel definition layer 41 are separated by a predetermined distance. FIG. 3E shows the array substrate structure after the second pixel definition layer 51 is formed.

Figure 4A:
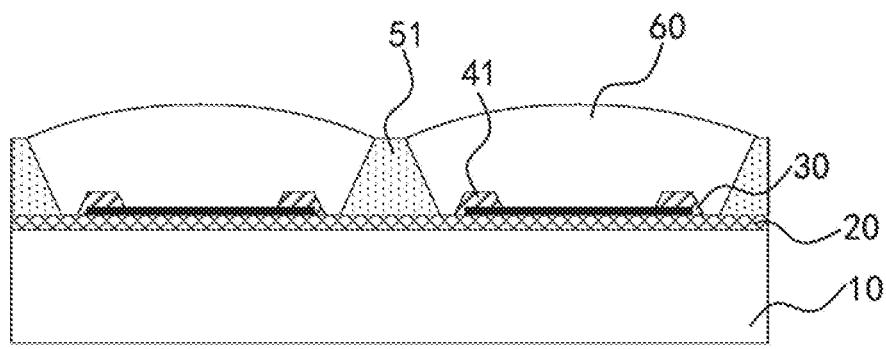
FIGS. 4A to 4C are schematic views showing the principle of forming an organic light-emitting layer of the present disclosure.
Figure 4B:
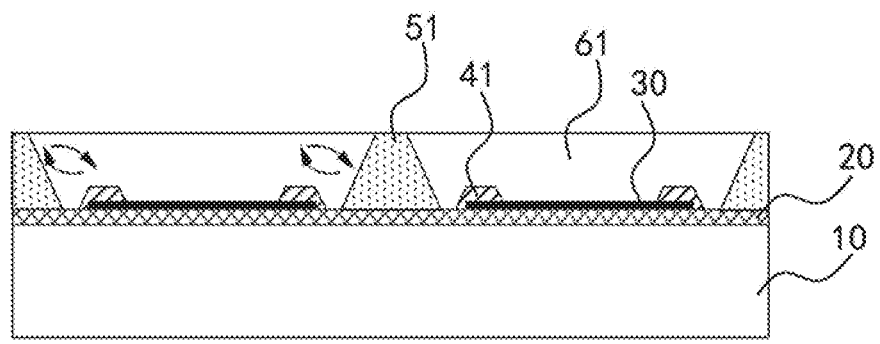
Figure 4C:
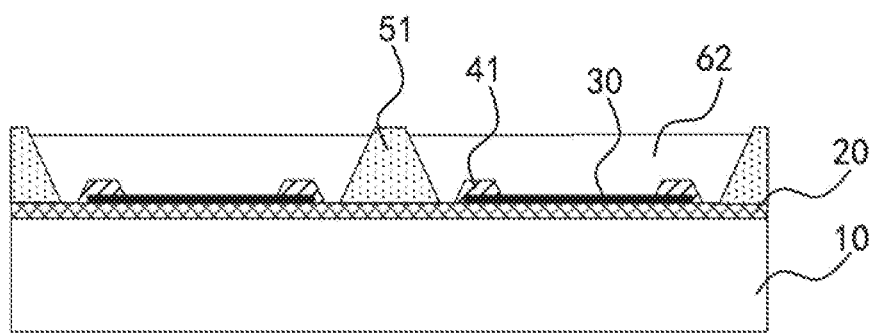

The array substrate of the present disclosure has two pixel definition layers, and adjacent dams of the two pixel definition layers are separated by a predetermined distance, thereby avoiding edge climbing defects generated during ink drying in the opening. The specific principle is shown in FIGS. 4A to 4C. First, as shown in FIG. 4A, immediately after printing the ink 60, the ink 60 in the opening is much higher than the second pixel definition layer 51 due to the surface tension, and then the above structure is dried to form a film. During the drying process, the edge solvent volatilizes quickly, which will cause the droplet to flow from the center to the edge of the solution. This flow will drive the solute to move to the edge, and that is why the conventional pixel definition layer causes the edge climbing. As the drying process progresses, as shown in FIG. 4B, the liquid surface of the incompletely dried ink 61 in the opening is similar to the second pixel definition layer 51, the incompletely dried ink 61 changes from a solution to a sol and thus the viscosity increases. When the height of the incompletely dried ink 61 is similar to that of the second pixel definition layer 51, since the drying solvent volatilizes very quickly under high vacuum, the solvent volatilization volume in each position is substantially the same. Since the adjacent dams of the two pixel-definition layers are separated by a predetermined distance, and there is no pixel electrode at the bottom of this area, the solvent contained in the incompletely dried ink in this area is more than that in other areas. Thus, the viscosity of the ink in this area is lower than that in other areas, so that the Marangoni reflow effect will occur in this area. This will allow the solute to flow from the edge back to the center, thereby alleviating the phenomenon of edge climbing and improving the uniformity of film formation. This situation is maintained for a predetermined time, the viscosity of the ink in the opening continues to increase, and finally the residual solvent is basically removed, the ink no longer flows, and a relatively flat organic light-emitting layer 62 is formed at the bottom of the opening of the pixel definition layer, as shown in FIG. 4C. As can be seen from the above description, the bottom of the dam of the second pixel definition layer 51 and the bottom of the dam of the first pixel definition layer 41 are separated by a "predetermined distance", in order to form the Marangoni reflow effect in the incompletely dried ink 61 during the formation of the organic light-emitting layer 62, thereby alleviating the edge climbing phenomenon. Therefore, in order to achieve the above purpose, a person skilled in the art can reasonably set the "predetermined distance" according to the type and viscosity of the ink; the pressure and temperature of the drying; the size of the array substrate, etc.

In summary, in the array substrate of the present disclosure, adjacent dams in the two pixel-definition layers are separated by a predetermined distance, thereby alleviating the ink climbing on the dams and improving the uniformity of film formation. Furthermore, in the display panel including the above array substrate, since the first pixel definition layer 41 and the second pixel definition layer 51 are separated by a predetermined distance, and there is no corresponding pixel electrode 30 at the edge portion of the formed organic light-emitting layer 62 adjacent to the dam of the second pixel defining layer 51, the edge portion of the organic light-emitting layer 62 adjacent to the second pixel definition layer 51 does not emit light, which can effectively suppress the light emission of the organic layer at, the edge of the pixel definition layer, thereby further improving the uniformity of light emission within the pixel.

In the array substrate of the present disclosure, adjacent dams in the two pixel definition layers are separated by a predetermined distance, thereby alleviating ink climbing at the edges and improving the uniformity of film formation. Furthermore, in the display panel including the above array substrate, since the first pixel definition layer and the second pixel definition layer are separated by a predetermined distance, and there is no corresponding pixel electrode at the edge portion of the formed organic light-emitting layer adjacent to the second pixel defining layer, the edge portion of the organic light-emitting layer does not emit light, which can effectively suppress the light emission of the organic layer at the edge of the pixel definition layer, thereby further improving the uniformity of light emission within the pixel.

Optionally, an embodiment of the present disclosure further provides a display device, which may include the above display panel, and the display device may be any product or component having a display function, such as a liquid crystal panel, an electronic paper, a mobile phone, a tablet computer, a television, a monitor, a notebook computer, a digital photo frame, a navigator, and the like.

Of course, there may be many other embodiments of the present disclosure. A person skilled in the art may make various corresponding changes and modifications based on the present disclosure without departing from the spirit and essence of the present disclosure, but these corresponding changes and deformations shall fall within the protection scope of the claims appended to this disclosure.

The invention claimed is:

1. A display panel comprising an array substrate, comprising:
   a base substrate;
   a planarization layer formed on the base substrate;
   a plurality of pixel electrodes formed on the planarization layer; and
   a pixel definition layer comprising a first pixel definition layer and a second pixel definition layer, the first pixel definition layer covering a periphery of each of the plurality of pixel electrodes and exposing a central area of each of the plurality of pixel electrodes, the second pixel definition layer being formed on the planarization layer between adjacent pixel electrodes and having a plurality of openings defining each sub-pixel unit; a bottom of a dam portion of the second pixel definition layer and a bottom of a dam portion of the first pixel definition layer adjacent thereto are separated by a predetermined distance, and a thickness of the second pixel definition layer is greater than a thickness of the first pixel definition layer,
   wherein a width of the first pixel definition layer covering the periphery of each of the plurality of pixel electrodes is 1 μm to 10 μm;
   wherein the plurality of openings of the second pixel defining layer is formed with an organic light-emitting layer of each sub-pixel unit, a thickness of the organic light-emitting layer being greater than a thickness of the first pixel definition layer;
   wherein the organic light-emitting layer is in direct contact with a side wall of the second pixel definition layer; and
   wherein the predetermined distance is configured to allow an ink forming the organic light-emitting layer have a Marangoni reflow effect occur in an area between the bottom of the dam portion of the second pixel definition layer and the bottom of a dam portion of the first pixel definition layer adjacent thereto.

2. A display device comprising the display panel of claim 1.

3. The display panel of claim 1, wherein the first pixel definition layer has a thickness of 100 nm to 500 nm, and the second pixel definition layer has a thickness of 1 μm to 3 μm.

4. The display panel of claim 1, wherein the first pixel definition layer comprises one or more of silicon nitride and silicon oxide.

5. The display panel of claim 1, wherein the second pixel definition layer comprises a photoresist material.

6. A method for preparing an array substrate, comprising:
   forming a planarization layer on a base substrate;
   forming a plurality of pixel electrodes on the planarization layer;
   forming a first pixel definition layer to cover a periphery of each of the plurality of pixel electrodes, the first pixel definition layer exposing a central area of each of the plurality of pixel electrodes; and
   forming a second pixel definition layer on the planarization layer between adjacent pixel electrodes, the second pixel definition layer having a plurality of openings defining each sub-pixel unit;
   wherein a bottom of a dam portion of the second pixel definition layer and a bottom of a dam portion of the first pixel definition layer adjacent thereto are separated by a predetermined distance, and a thickness of the second pixel definition layer is greater than a thickness of the first pixel definition layer;

wherein a width of the first pixel definition layer covering the periphery of each of the plurality of pixel electrodes is 1 µm to 10 µm;

wherein the plurality of openings of the second pixel defining layer is formed with an organic light-emitting layer of each sub-pixel unit, a thickness of the organic light-emitting layer being greater than a thickness of the first pixel definition layer;

wherein the organic light-emitting layer is in direct contact with a side wall of the second pixel definition layer; and wherein the predetermined distance is configured to allow an ink forming the organic light-emitting layer have a Marangoni reflow effect occur in an area between the bottom of the dam portion of the second pixel definition layer and the bottom of a dam portion of the first pixel definition layer adjacent thereto.

7. The method of claim 6, wherein the forming the first pixel definition layer comprises:

forming an insulating dielectric layer covering the planarization layer and the plurality of pixel electrodes; and etching the insulating dielectric layer to form the first dielectric layer.

8. The method of claim 7, wherein the insulating dielectric layer comprises one or more of silicon nitride and silicon oxide.

9. The method of claim 6, wherein the forming the second pixel definition layer comprises:

forming a photoresist material layer covering the planarization layer, the first pixel definition layer, and the plurality of pixel electrodes; and patterning the photoresist material layer to form the second pixel definition layer.

10. The method of claim 6, wherein the first pixel definition layer has a thickness of 100 nm to 500 nm, and the second pixel definition layer has a thickness of 1 µm to 3 µm.

\* \* \* \* \*